(12) United States Patent
Holmes et al.

(10) Patent No.: US 10,978,631 B2
(45) Date of Patent: Apr. 13, 2021

(54) COMBINED DOLAN BRIDGE AND QUANTUM DOT JOSEPHSON JUNCTION IN SERIES

(71) Applicant: INTERNATIONAL BUSINESS MACHINES CORPORATION, Armonk, NY (US)

(72) Inventors: Steven J. Holmes, Ossining, NY (US); Devendra K. Sadana, Pleasantville, NY (US); Ning Li, White Plains, NY (US); Stephen W. Bedell, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/567,748

(22) Filed: Sep. 11, 2019

(65) Prior Publication Data
US 2021/0074903 A1 Mar. 11, 2021

(51) Int. Cl.
*H01L 39/02* (2006.01)
*H01L 39/04* (2006.01)
(Continued)

(52) U.S. Cl.
CPC ........... *H01L 39/025* (2013.01); *G06N 10/00* (2019.01); *H01L 39/045* (2013.01);
(Continued)

(58) Field of Classification Search
CPC . H01L 39/025; H01L 39/2493; H01L 39/249; H01L 39/045; H01L 21/02603;
(Continued)

(56) References Cited

U.S. PATENT DOCUMENTS 10,134,972 B2 11/2018 Oliver et al.
2004/0029050 A1* 2/2004 Brenner ................. B82Y 10/00
430/312
(Continued)

FOREIGN PATENT DOCUMENTS

EP 0818830 A1 1/1998

OTHER PUBLICATIONS

Yu-Lin et al., "Fabrication of Al/AlOx/Al Josephson junctions and superconducting quantum by shadow evaporation and a dynamic oxidation process", Chin. Phys. B, vol. 22, No. 6, 2013, pp. 060309-1-060309-5.
(Continued)

*Primary Examiner* — Jarrett J Stark
(74) *Attorney, Agent, or Firm* — Henry J. Daley; Venable LLP

(57) ABSTRACT

A method of producing a quantum circuit includes forming a mask on a substrate to cover a first portion of the substrate, implanting a second portion of the substrate with ions, and removing the mask, thereby providing a nanowire. The method further includes forming a first lead and a second lead, the first lead and the second lead each partially overlapping the nanowire. In operation, a portion of the nanowire between the first and second leads forms a quantum dot, thereby providing a quantum dot Josephson junction. The method further includes forming a third lead and a fourth lead, one of the third and fourth leads partially overlapping the nanowire, wherein the third lead is separated from the fourth lead by a dielectric layer, thereby providing a Dolan bridge Josephson junction. The nanowire is configured to connect the quantum dot Josephson junction and the Dolan bridge Josephson junction in series.

7 Claims, 11 Drawing Sheets

(51) Int. Cl.
*G06N 10/00* (2019.01)
*H01L 39/24* (2006.01)
*H01L 39/22* (2006.01)
*H01L 21/02* (2006.01)

(52) U.S. Cl.
CPC .......... *H01L 39/223* (2013.01); *H01L 39/249* (2013.01); *H01L 39/2493* (2013.01); *H01L 21/02603* (2013.01); *H01L 2221/1094* (2013.01)

(58) Field of Classification Search
CPC .... H01L 2221/109; H01L 39/223–226; G06N 10/00
See application file for complete search history.

(56) References Cited

U.S. PATENT DOCUMENTS

| | | | |
|---|---|---|---|
| 2006/0151775 A1* | 7/2006 | Hollenberg | G06N 10/00 257/14 |
| 2018/0219150 A1 | 8/2018 | Lanting et al. | |
| 2018/0308896 A1 | 10/2018 | Ladizinsky et al. | |
| 2018/0358537 A1* | 12/2018 | Brink | H01L 39/223 |
| 2019/0042967 A1 | 2/2019 | Yoscovits et al. | |
| 2019/0131513 A1 | 5/2019 | Krogstrup et al. | |
| 2019/0137891 A1* | 5/2019 | Brink | G03F 1/36 |
| 2020/0334104 A1* | 10/2020 | Rosenblum | G06N 10/00 |

OTHER PUBLICATIONS

Van Dam et al., "Supercurrent reversal in quantum dots", Nature 442.7103 (2006): 667 (19 pages total).

Nakamura et al., "Coherent control of macroscopic quantum states in a single-Cooper-pair box", arXiv:cond-mat/9904003v1 [cond-mat.mes-hall] Apr. 1, 1999, (8 pages total).

Jørgensen et al., "Critical Current 0-π Transition in Designed Josephson Quantum Dot Junctions", arXiv:0707.3613v1 [cond-mat.supr-con] Jul. 24, 2007, pp. 1-5.

Szombati et al., "Josephson φ0-junction in nanowire quantum dots," Nature Physics 12.6 (2016): 568.

Moschetti et al., "Planar InAs/AlSb HEMTs With Ion-Implanted Isolation", IEEE Electron Device Letters, vol. 33, No. 4, Apr. 2012, pp. 510-512.

Sandall et al., "Planar InAs photodiodes fabricated using He ion implantation", Optics Express, vol. 20, No. 8, Mar. 28, 2012, pp. 8575-8583.

"Future Technologies for the Electrical Isolation of III-V Semiconductor Devices", Final report on grant No. GR/N32969, Sch of Electronics & Physical Sciences, University of Surrey, 2003.

* cited by examiner

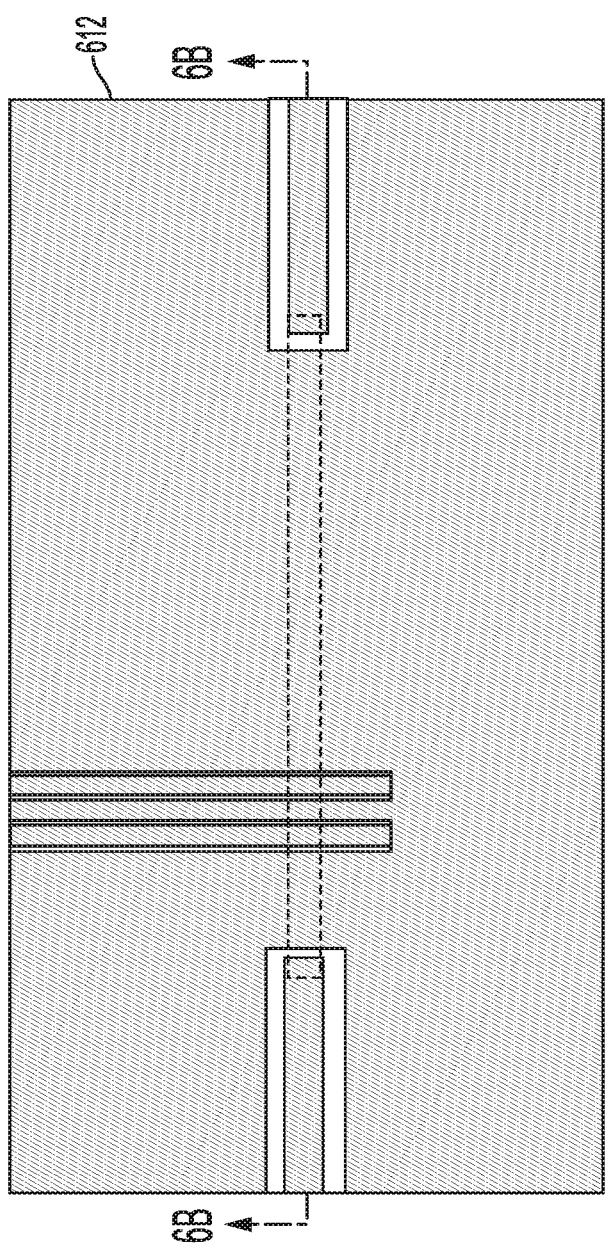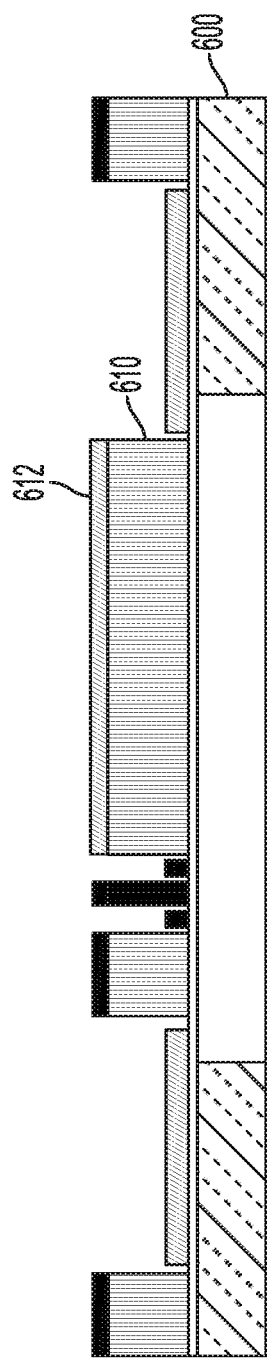
FIG. 6A
FIG. 6B

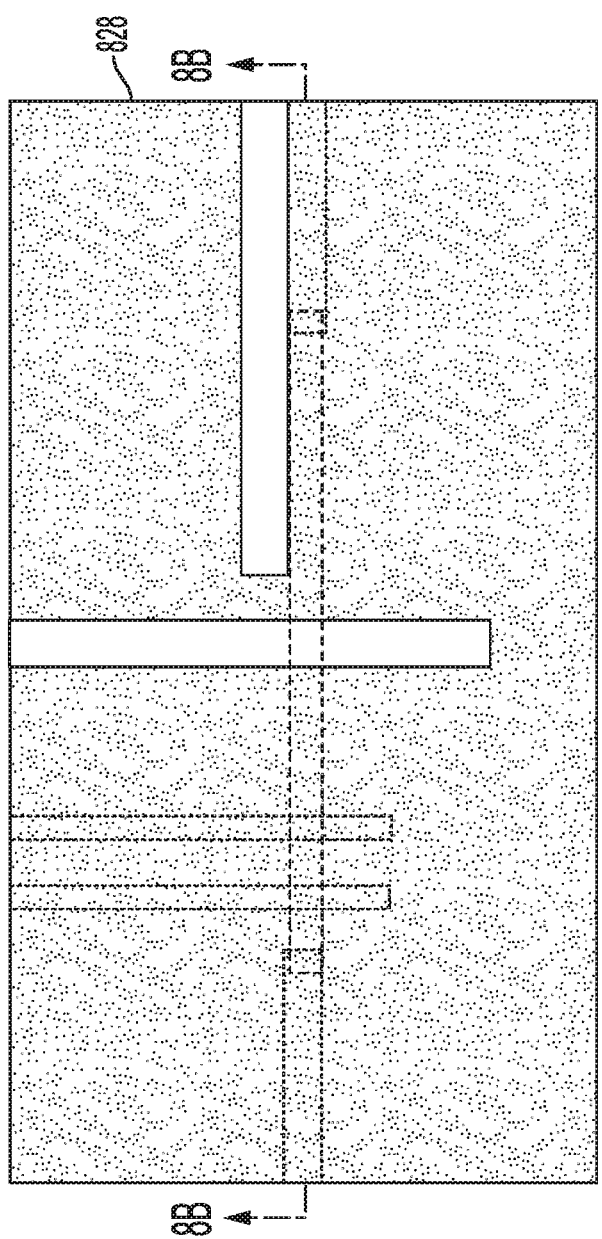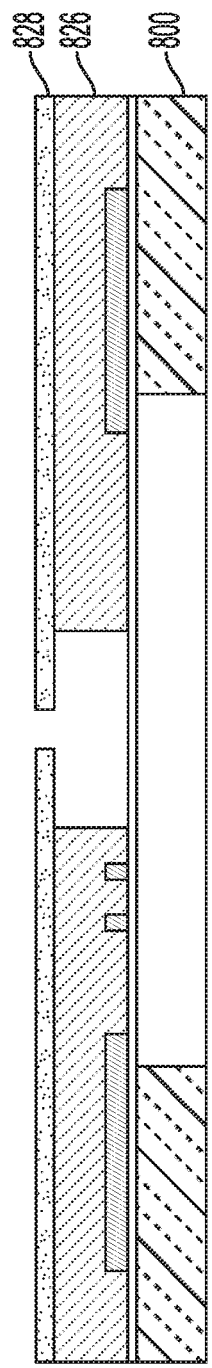
FIG. 8A
FIG. 8B

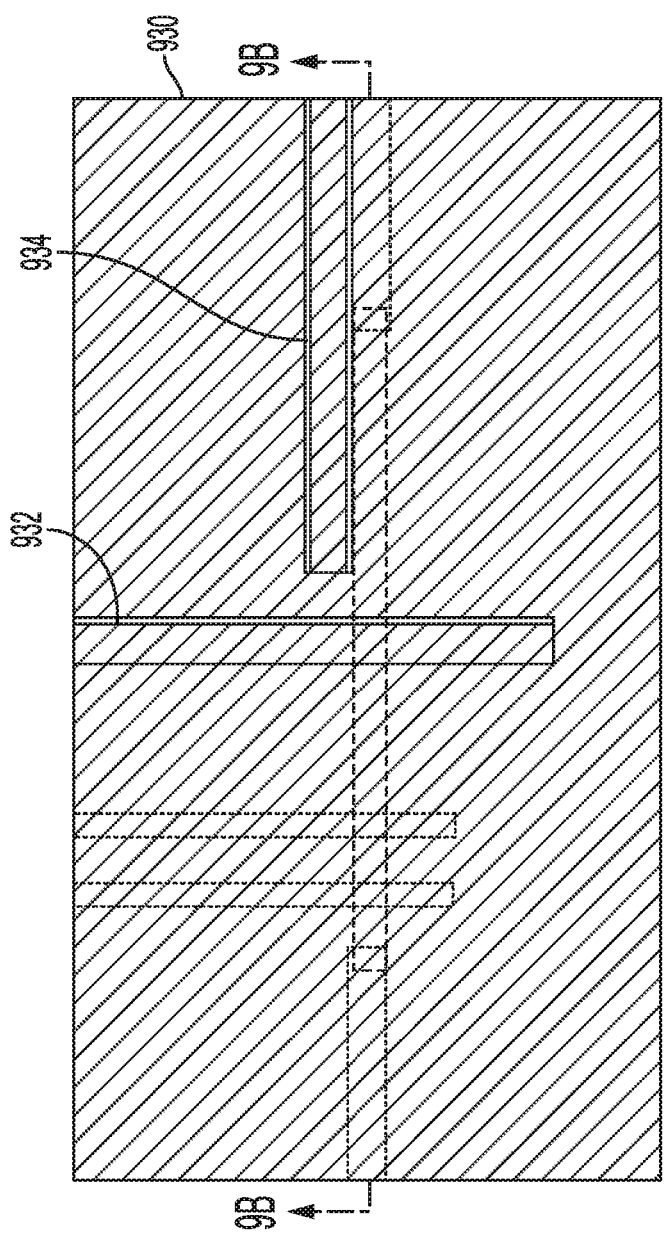
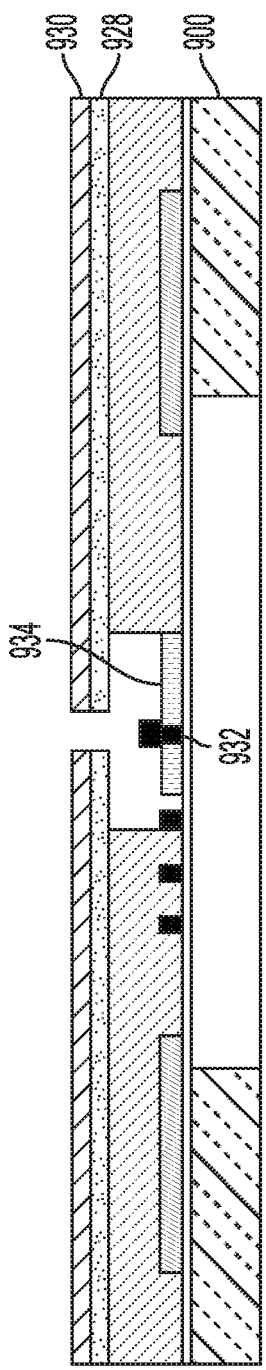
FIG. 9A
FIG. 9B

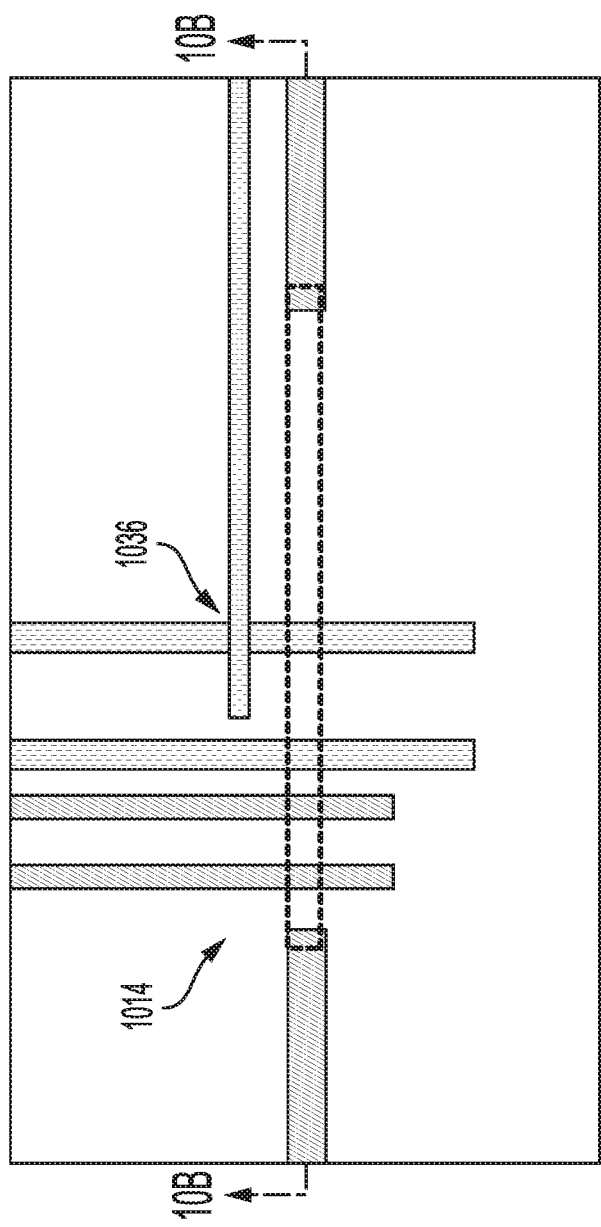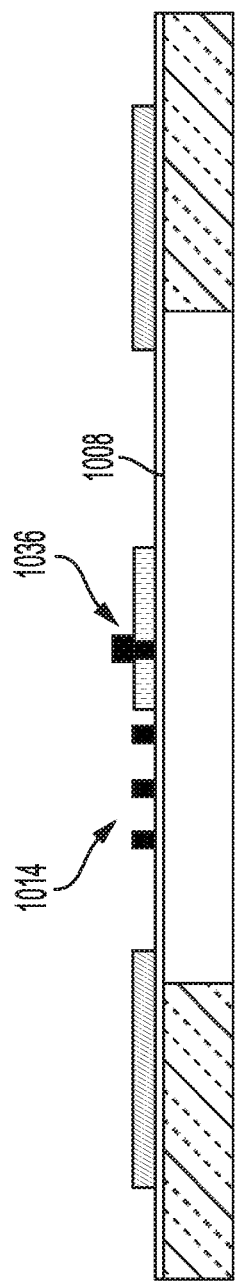
FIG. 10A
FIG. 10B

COMBINED DOLAN BRIDGE AND QUANTUM DOT JOSEPHSON JUNCTION IN SERIES

BACKGROUND

The present invention relates to Josephson junctions, and more specifically, to a Dolan bridge Josephson junction and a quantum dot Josephson junction connected in series.

Quantum computers require large numbers of qubits, and combining different types of qubits in a single quantum processor may be advantageous. For example, the ability to combine different types of qubits may have applications in frequency tuning, quantum memory, sensing of qubit states, error correction, and redundancy.

SUMMARY

According to an embodiment of the present invention, a method of producing a quantum circuit includes forming a mask on a substrate to cover a first portion of the substrate, implanting a second portion of the substrate not covered by the mask with ions, and removing the mask, thereby providing a nanowire comprising the first portion of the substrate. The method further includes forming a first lead and a second lead on top of the substrate, the first lead being spaced apart from the second lead, the first lead and the second lead each partially overlapping the nanowire, wherein, in operation, a portion of the nanowire between the first and second leads forms a quantum dot, thereby providing a quantum dot Josephson junction. The method further includes forming a third lead and a fourth lead on top of the substrate, one of the third lead and the fourth lead partially overlapping the nanowire, wherein the third lead is separated from the fourth lead by a dielectric layer, thereby providing a Dolan bridge Josephson junction. The nanowire is configured to connect the quantum dot Josephson junction and the Dolan bridge Josephson junction in series.

According to an embodiment of the present invention, a quantum circuit includes a substrate, the substrate including a first portion forming a nanowire and a second portion surrounding the first portion. The quantum circuit includes a first lead and a second lead formed on top of the substrate, the first lead being spaced apart from the second lead, the first lead and the second lead each partially overlapping the nanowire, wherein, in operation, a portion of the nanowire between the first and second leads forms a quantum dot, thereby providing a quantum dot Josephson junction. The quantum circuit includes a third lead and a fourth lead formed on top of the substrate, one of the third lead and the fourth lead partially overlapping the nanowire, wherein the third lead is separated from the fourth lead by a dielectric layer, thereby providing a Dolan bridge Josephson junction. The nanowire is configured to connect the quantum dot Josephson junction and the Dolan bridge Josephson junction in series.

According to an embodiment of the present invention, a quantum computer includes a refrigeration system under vacuum comprising a containment vessel, and a qubit chip contained within a refrigerated vacuum environment defined by the containment vessel, wherein the qubit chip includes a quantum circuit. The quantum computer includes an electromagnetic waveguide arranged within the refrigerated vacuum environment so as to direct electromagnetic energy to and receive electromagnetic energy from the quantum circuit. The quantum circuit includes a substrate, the substrate including a first portion forming a nanowire and a second portion surrounding the first portion. The quantum circuit includes a first lead and a second lead formed on top of the substrate, the first lead being spaced apart from the second lead, the first lead and the second lead each partially overlapping the nanowire, wherein, in operation, a portion of the nanowire between the first and second leads forms a quantum dot, thereby providing a quantum dot Josephson junction. The quantum circuit includes a third lead and a fourth lead formed on top of the substrate, one of the third lead and the fourth lead partially overlapping the nanowire, wherein the third lead is separated from the fourth lead by a dielectric layer, thereby providing a Dolan bridge Josephson junction. The nanowire is configured to connect the quantum dot Josephson junction and the Dolan bridge Josephson junction in series.

BRIEF DESCRIPTION OF THE DRAWINGS

FIG. 6A is a schematic illustration of a plan view of a substrate with a liftoff mask formed thereon, and a metal deposited on the substrate and liftoff mask.

FIG. 6B is a schematic illustration of a cross-sectional view of a substrate with a liftoff mask formed thereon, and a metal deposited on the substrate and liftoff mask.

FIG. 8A is a schematic illustration of a plan view of a substrate with a liftoff mask having a first layer and a second layer formed thereon.

FIG. 8B is a schematic illustration of a cross-sectional view of a substrate with a liftoff mask having a first layer and a second layer formed thereon.

FIG. 9A is a schematic illustration of a plan view of a substrate with a metal layer deposited on the second layer of the liftoff mask.

FIG. 9B is a schematic illustration of a cross-sectional view of a substrate with a metal layer deposited on the second layer of the liftoff mask.

FIG. 10A is a schematic illustration of a plan view of the device of FIG. 9A after removal of the liftoff mask.

FIG. 10B is a schematic illustration of a cross-sectional view of the device of FIG. 9B after removal of the liftoff mask.

DETAILED DESCRIPTION

Figure 1:
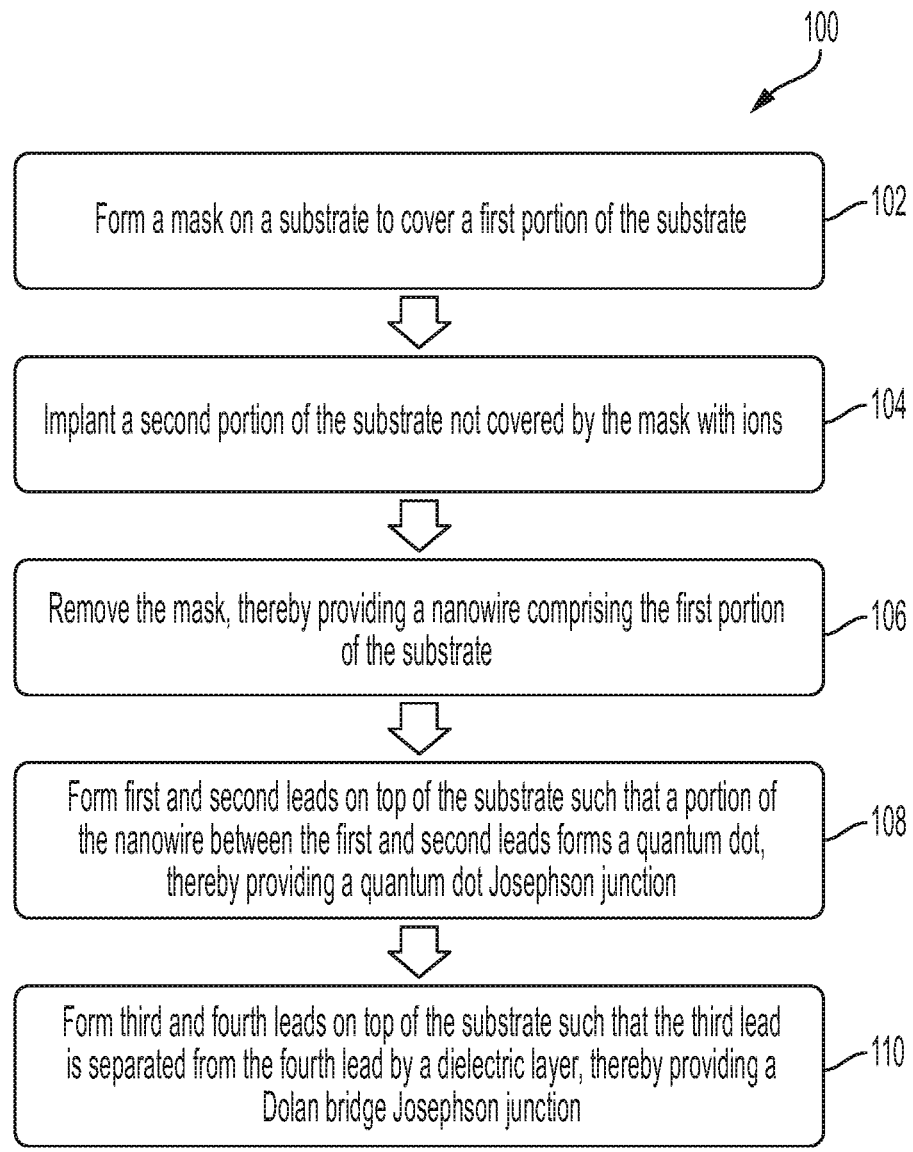
FIG. 1 is a flowchart that illustrates a method of producing a quantum circuit according to an embodiment of the current invention.

FIG. 1 is a flowchart that illustrates a method 100 of producing a quantum circuit according to an embodiment of the current invention. The method 100 includes forming a mask on a substrate to cover a first portion of the substrate 102, and implanting a second portion of the substrate not covered by the mask with ions 104. The method 100 includes removing the mask, thereby providing a nanowire comprising the first portion of the substrate 106. The method 100 includes forming a first lead and a second lead on top of the substrate, the first lead being spaced apart from the second lead, the first lead and the second lead each partially overlapping the nanowire, wherein, in operation, a portion of the nanowire between the first and second leads forms a quantum dot, thereby providing a quantum dot Josephson junction 108. The method 100 includes forming a third lead and a fourth lead on top of the substrate, one of the third lead and the fourth lead partially overlapping the nanowire, wherein the third lead is separated from the fourth lead by a dielectric layer, thereby providing a Dolan bridge Josephson junction 110. The nanowire is configured to connect the quantum dot Josephson junction and the Dolan bridge Josephson junction in series.

According to an embodiment of the present invention, forming the first lead and the second lead may include forming the first lead and the second lead to be substantially perpendicular to the nanowire.

According to an embodiment of the present invention, forming the third lead and the fourth lead includes forming the third lead on the substrate such that the third lead partially overlaps the nanowire, oxidizing the third lead to form the dielectric layer, and forming the fourth lead in contact with the dielectric layer.

The third lead may extend substantially perpendicular to the fourth lead, and to the nanowire. However, the embodiments of the invention are not limited to this configuration.

According to an embodiment of the present invention, the method 100 further includes forming a nanowire source lead and a nanowire drain lead on the substrate. The nanowire source lead may be formed to overlap the nanowire at a first end of the nanowire, and the nanowire drain lead may be formed to overlap the nanowire at a second end of the nanowire opposing the first end.

According to an embodiment of the present invention, at least one of the forming the first and second leads and the forming the third and fourth leads includes lift off processing.

Figure 2:
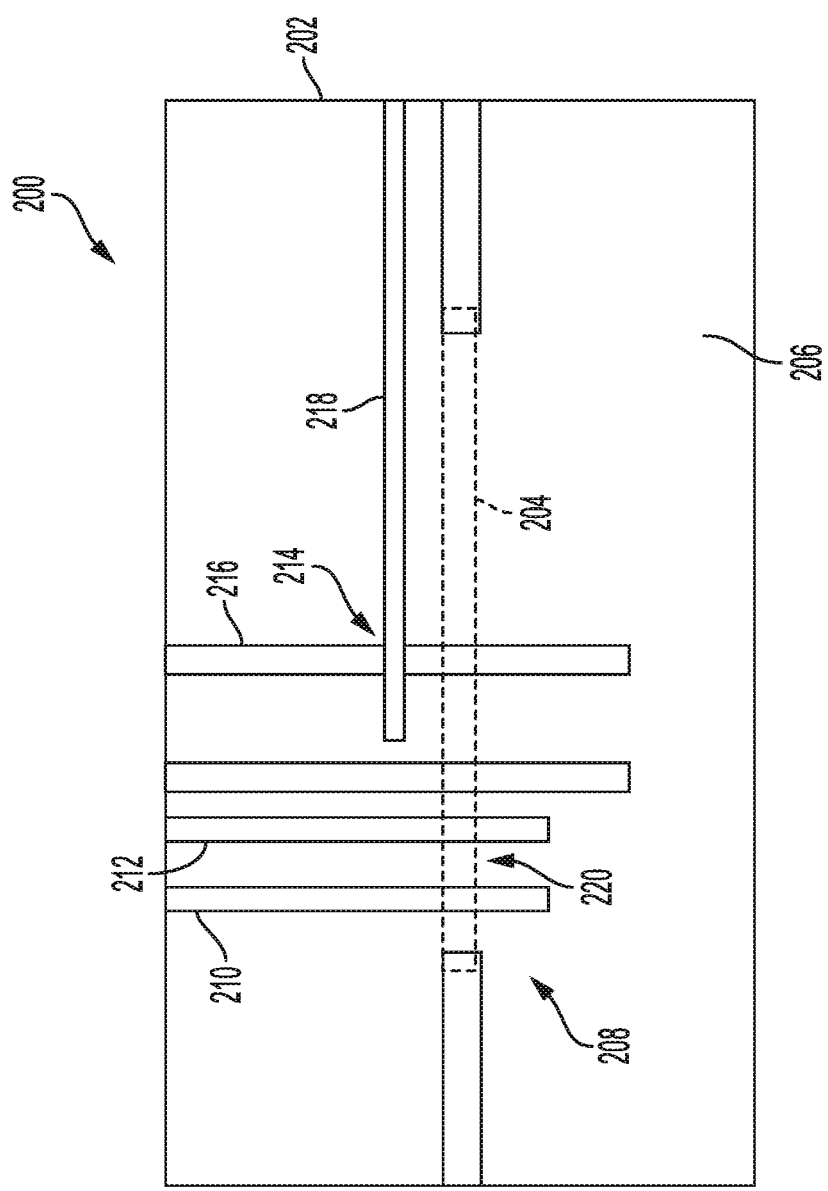
FIG. 2 is a schematic illustration of a quantum circuit according to an embodiment of the present invention.

FIG. 2 is a schematic illustration of a quantum circuit 200 according to an embodiment of the present invention. The quantum circuit 200 includes a substrate 202. The substrate 202 includes a first portion forming a nanowire 204 and a second portion 206 surrounding the first portion. The quantum circuit 200 includes a first lead 210 and a second lead 212 formed on top of the substrate 202. The first lead 210 is spaced apart from the second lead 212, and the first lead 210 and the second lead 212 each partially overlap the nanowire 204. In operation, a portion 220 of the nanowire 204 between the first lead 210 and the second lead 212 forms a quantum dot, thereby providing a quantum dot Josephson junction 208. The quantum circuit 200 includes a third lead 216 and a fourth lead 218 formed on top of the substrate 202. One of the third lead 216 and the fourth lead 218 partially overlaps the nanowire 204. The third lead 216 is separated from the fourth lead 218 by a dielectric layer, thereby providing a Dolan bridge Josephson junction 214. The nanowire 204 is configured to connect the quantum dot Josephson junction 208 and the Dolan bridge Josephson junction 214 in series.

According to an embodiment of the present invention, the first and second leads 210, 212 of the quantum dot Josephson junction 208 extend substantially perpendicular to the nanowire 204. However, embodiments of the invention are not limited to this configuration. The first and second leads 210, 212 of the quantum dot Josephson junction 208 may have other orientations with respect to each other, and to the nanowire 204.

According to an embodiment of the present invention, the first portion of the substrate 202 forming the nanowire 204 includes indium arsenide (InAs), and the second portion 206 of the substrate 202 includes InAs implanted with ions. The substrate may include other materials besides or in addition to InAs, for example, 3-5 materials, gallium arsenide (GaAs), or indium gallium arsenide (InGaAs). The ions may be, for example, hydrogen, oxygen, helium, or argon. The nanowire 204 according to an embodiment of the present invention has a width less than 50 nm, and a length between 100 nm and 1000 nm. The nanowire 204 according to an embodiment of the present invention has a length between 500 nm and 1000 nm.

According to an embodiment of the present invention, the third lead 216 of the Dolan bridge Josephson junction 214 extends substantially perpendicular to the fourth lead 218. The third lead 216 of the Dolan bridge Josephson junction 214 may also extend substantially perpendicular to the nanowire 204. However, embodiments of the invention are not limited to these orientations of the third lead 216 with respect to the fourth lead 218 and the nanowire 204.

According to an embodiment of the present invention, the quantum circuit 200 includes a nanowire source lead 222 and a nanowire drain lead 224 formed on the substrate 202. The nanowire source lead 222 overlaps the nanowire 204 at a first end of the nanowire 204, and the nanowire drain lead 224 overlaps the nanowire 204 at a second end of the nanowire 204. The nanowire source lead 222 and nanowire drain lead 224 can be run out to pads, and can contact the pads directly with wire bonding or other methods. The pads can be used to control the current through the nanowire to connect the quantum dot Josephson junction 208 and the Dolan bridge Josephson junction 214 in series.

FIGS. 3A-10B are schematic illustrations of a process that can be used to form a quantum circuit according to an embodiment of the present invention. In FIGS. 3A-10B, like reference numerals refer to like features, for example, reference numeral 300 in FIG. 3B and 400 in FIG. 4B both refer to a substrate. The process schematically illustrated in FIGS. 3-12 may employ liftoff processing techniques.

Figure 3A:
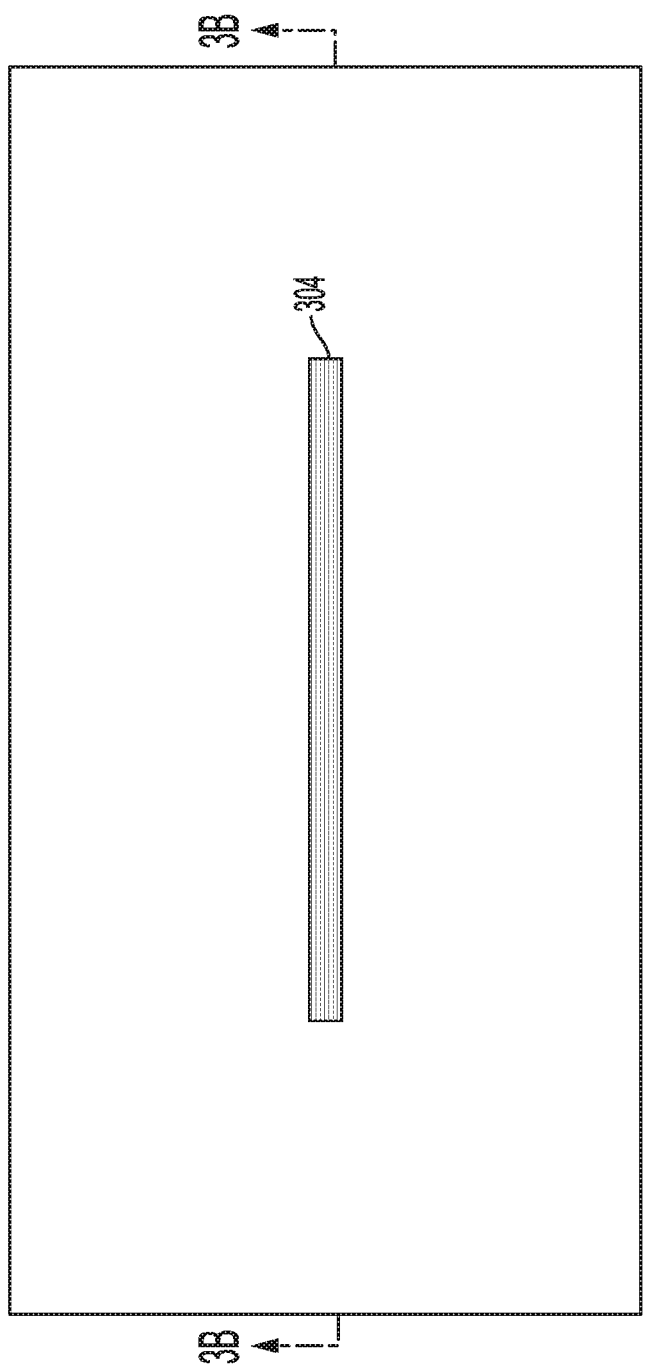
FIG. 3A is a schematic illustration of a plan view of a substrate.
Figure 3B:
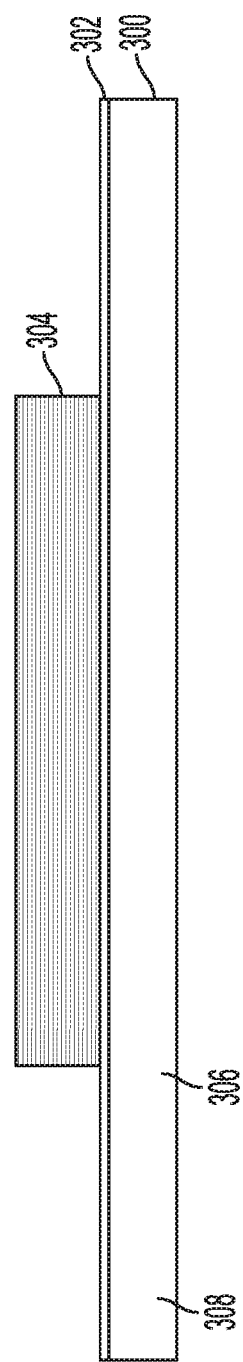
FIG. 3B is a schematic illustration of a cross-sectional view of a substrate.

FIGS. 3A and 3B are schematic illustrations of a plan view and a cross-sectional view of a substrate 300. The substrate 300 may include, for example, InAs. The substrate 300 may include a capping layer 302. The process of forming a quantum circuit may include forming a nanowire in the substrate 300. The process of forming the nanowire may include forming a photoresist 304 to cover a first portion 306 of the substrate 300, and then implanting a second portion 308 of substrate 300 not covered by the mask 304 with ions, and removing the mask 304. According to an embodiment of the present invention, the second portion 308 of the substrate 300 is implanted with helium or hydrogen ions. The photoresist 304 may have a size that is substantially the size of the nanowire to be formed. The photoresist 304 may be formed, for example, using a 193 expose tool and off-axis illumination, such as dipole illumination, or quadrupole illumination. The pattern may be formed in resist and used as such, or it may be etched into a hard mask, such as Si or Ti, and a reactive ion etching process can be used to shrink the size of the resist space, if needed, for example, from 70 nm to 50 nm or smaller.

Figure 4A:
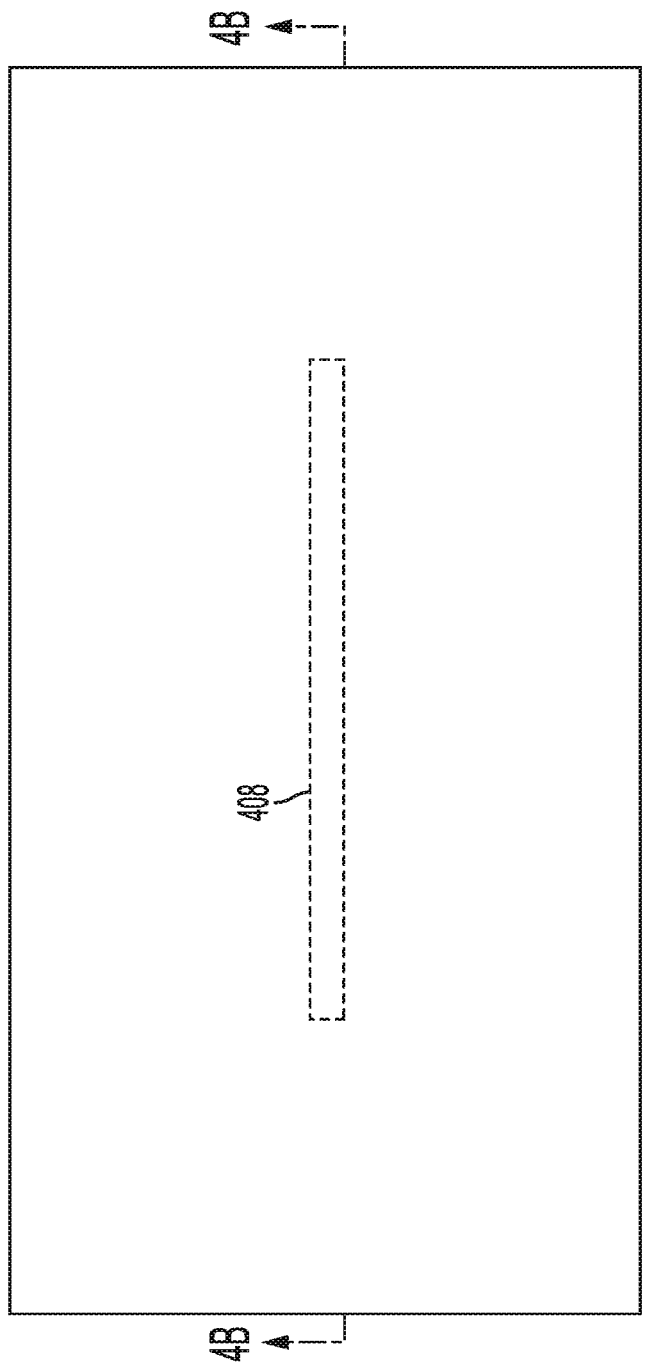
FIG. 4A is a schematic illustration of a plan view of a substrate with a nanowire formed therein.
Figure 4B:
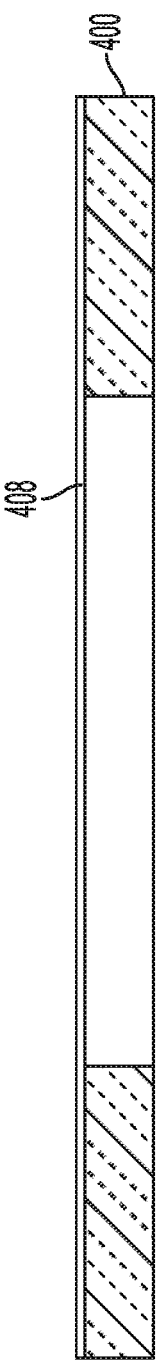
FIG. 4B is a schematic illustration of a cross-sectional view of a substrate with a nanowire formed therein.

FIGS. 4A and 4B are schematic illustrations of a plan view and a cross-sectional view of a substrate 400 with a nanowire 408 formed therein. The first portion 306 of the substrate 300 in FIG. 3B forms the nanowire 408.

Figure 5A:
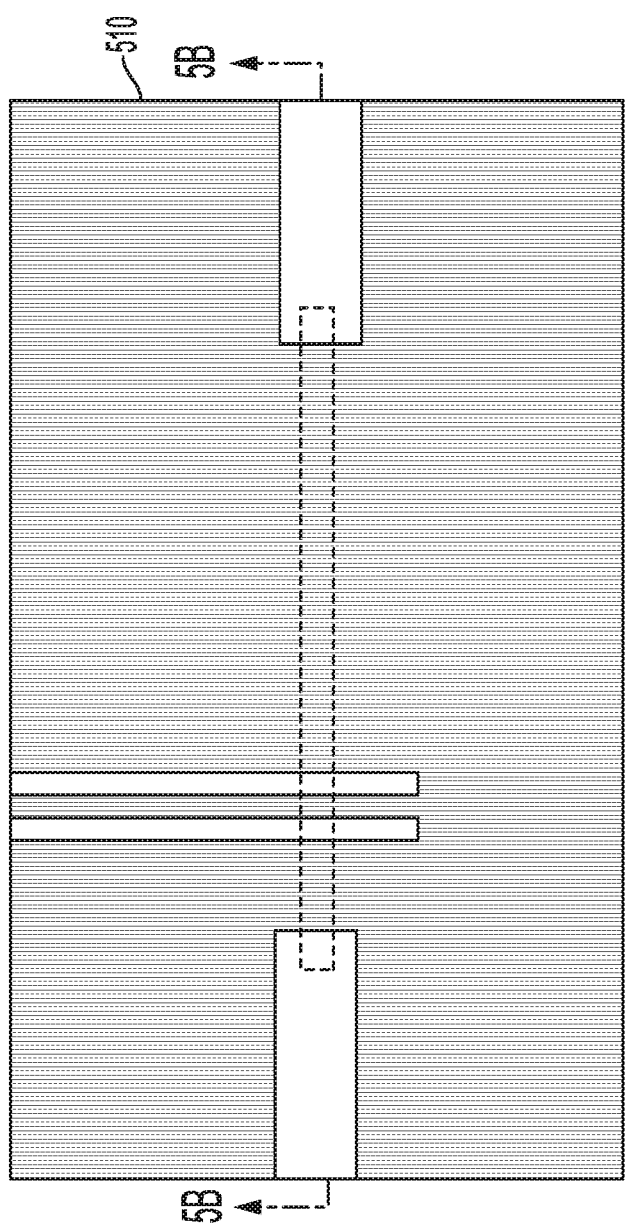
FIG. 5A is a schematic illustration of a plan view of a substrate with a liftoff mask formed thereon.
Figure 5B:
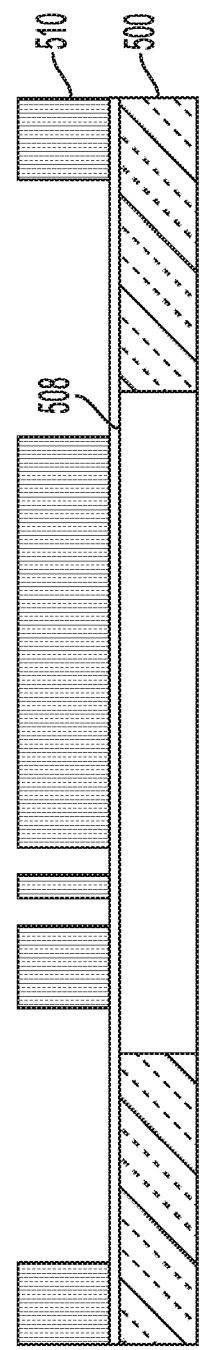
FIG. 5B is a schematic illustration of a cross-sectional view of a substrate with a liftoff mask formed thereon.

The process of forming a quantum circuit includes forming a quantum dot Josephson junction on the substrate. FIGS. 5A and 5B are schematic illustrations of a plan view and a cross-sectional view of a substrate 500 with a liftoff mask 510 formed thereon. The liftoff mask 510 is patterned for formation of the quantum dot, as well as source and drain leads for the nanowire 508. Patterning the resist 510 may include depositing the resist, exposing it, and developing it.

FIGS. 6A and 6B are schematic illustrations of a plan view and a cross-sectional view of a substrate 600 with a liftoff mask 610 formed thereon, and a metal 612 deposited on the substrate 600 and liftoff mask 610. The metal 612 may be deposited by evaporation, for example, which can be directional enough not to coat the sidewalls of the lift off stack. Alternatively, the metal 612 may be deposited by, for example, molecular-beam epitaxy, sputter deposition, or chemical vapor deposition with a directional ion control method. The deposition methods described herein are provided as examples, and the embodiments of the invention are not limited to these deposition methods. The metal 612 may be any metal used for quantum dot Josephson junction wiring, as long as it does not have sufficient stress to distort the liftoff mask 610. The metal 612 may include, for example, aluminum, lead, titanium, tungsten, or vanadium. After deposition of the metal 612, the process includes lifting off the liftoff mask 610.

Figure 7A:
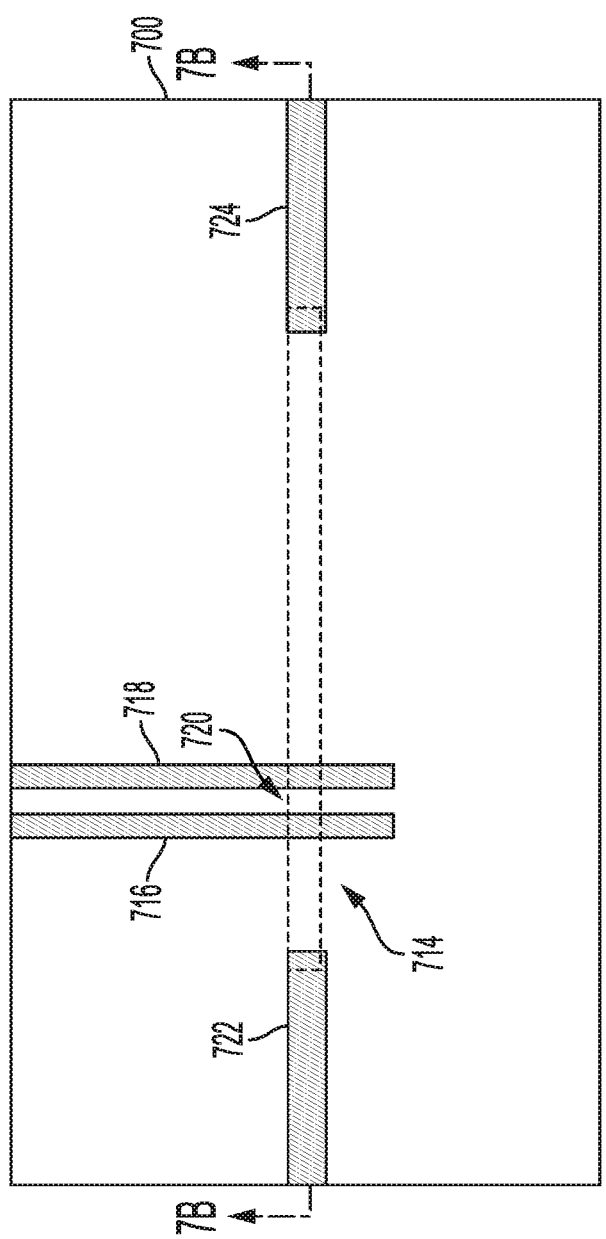
FIG. 7A is a schematic illustration of a plan view of a substrate with a leads of a quantum dot Josephson junction formed thereon.
Figure 7B:
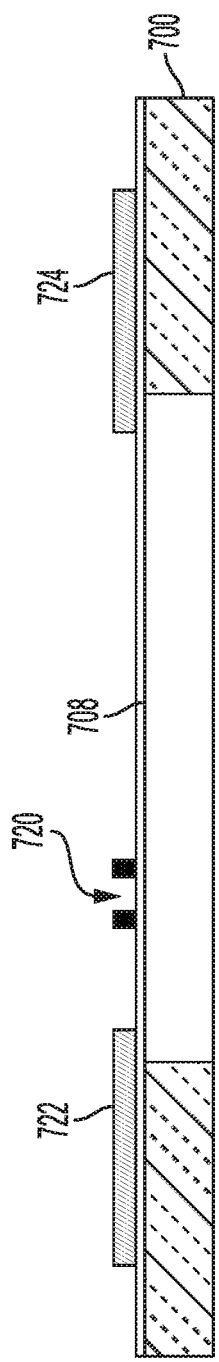
FIG. 7B is a schematic illustration of a cross-sectional view of a substrate with a leads of a quantum dot Josephson junction formed thereon.

FIGS. 7A and 7B are schematic illustrations of a plan view and a cross-sectional view of a substrate 700 with a leads of a quantum dot Josephson junction 714 formed thereon. The quantum dot Josephson junction 714 includes a first lead 716 and a second lead 718 spaced apart from the first lead 716. The first lead 716 and the second lead 718 each partially overlap the nanowire 708. A portion of the nanowire 708 between the first and second leads 716, 718 of the quantum dot Josephson junction 714 forms a quantum dot 720.

The process of forming a quantum circuit may include forming a nanowire source lead 722 and a nanowire drain lead 724 on the substrate 700. The nanowire source 722 lead may be formed to overlap the nanowire 708 at a first end, and the nanowire drain lead 724 may be formed to overlap the nanowire 708 at a second end opposing the first end.

The process of forming a quantum circuit includes forming a Dolan bridge Josephson junction on top of the substrate. FIGS. 8A and 8B are schematic illustrations of a plan view and a cross-sectional view of a substrate 800 with a liftoff mask having a first layer 826 and a second layer 828 formed thereon. The first layer 826 and the second layer 828 are patterned to exposed portions of the substrate 800 on which the Dolan bridge Josephson junction will be formed. The first layer 826 may include, for example, an organic polymer. The second layer 828 may include, for example, titanium or silicon. The first layer 826 and second layer 828 may be chosen such that etching exposes a portion of the substrate 800 that is larger than the area of the opening in the second layer 828. For example, the first layer 826 and second layer 828 may be etched using reactive ion etching. The etching may etch the first layer 826 more quickly than the second layer 828.

FIGS. 9A and 9B are schematic illustrations of a plan view and a cross-sectional view of a substrate 900 with a metal layer 930 deposited on the second layer 928 of the liftoff mask. The metal layer 930 may include, for example, aluminum, lead, titanium, tungsten, vanadium, or niobium, for example, and the deposition method may be directional. The metal layer 930 according to an embodiment of the present invention may be deposited in two steps: 90 degree metal evaporation and 45 degree metal evaporation. The 90 degree evaporation results in a third lead 932 of the Dolan bridge Josephson junction. The 45 degree evaporation results in a fourth lead 934. The third lead 932 may be exposed to oxygen prior to formation of the fourth lead 934, forming an oxide layer between the third lead 932 and the fourth lead 934. The oxide layer acts as the dielectric layer of the Dolan bridge Josephson junction. However, embodiments of the invention are not limited to the dielectric layer being an oxide layer. Alternative methods for forming the dielectric layer may be used. One of the third lead 932 and the fourth lead 934 partially overlaps the nanowire. As shown in FIG. 9A, the third lead 932 partially overlaps the nanowire.

FIGS. 10A and 10B are schematic illustrations of a plan view and a cross-sectional view of the device of FIGS. 9A and 9B after removal of the liftoff mask. The nanowire 1008 connects the quantum dot Josephson junction 1014 and the Dolan bridge Josephson junction 1036 in series.

Figure 11:
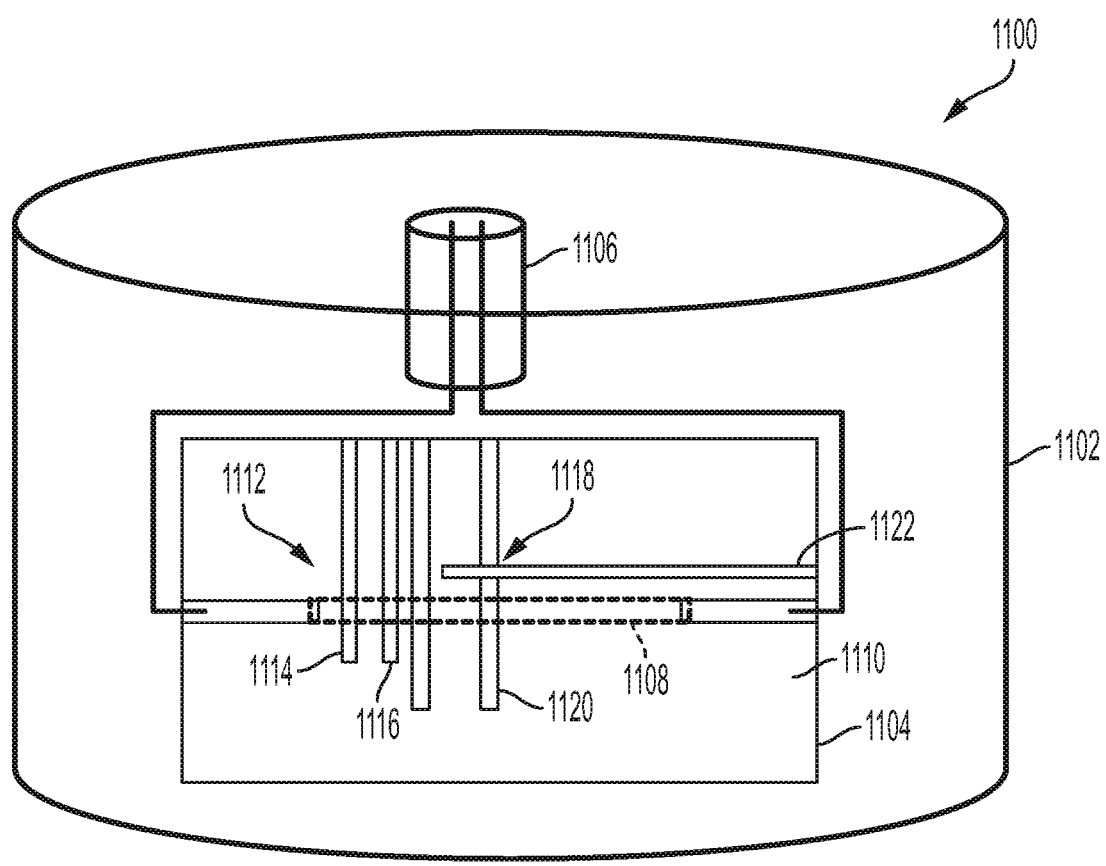
FIG. 11 is a schematic illustration of a quantum computer according to an embodiment of the present invention.

FIG. 11 is a schematic illustration of a quantum computer 1100 according to an embodiment of the present invention. The quantum computer 1100 includes a refrigeration system under vacuum including a containment vessel 1102, and a qubit chip 1104 contained within a refrigerated vacuum environment defined by the containment vessel 1102. The qubit chip 1104 includes a quantum circuit. The quantum computer 1100 includes an electromagnetic waveguide 1106 arranged within the refrigerated vacuum environment so as to direct electromagnetic energy to and receive electromagnetic energy from the quantum circuit. The quantum circuit includes a substrate, the substrate including a first portion forming a nanowire 1108 and a second portion 1110 surrounding the first portion.

The quantum circuit includes a first lead 1114 and a second lead 1116 formed on top of the substrate. The first lead 1114 is spaced apart from the second lead 1116. The first lead and the second lead each partially overlap the nanowire 1108. In operation, a portion of the nanowire 1108 between the first and second leads 1114, 1116 forms a quantum dot, thereby providing a quantum dot Josephson junction 1112.

The quantum circuit includes a third lead 1120 and a fourth lead 1122 formed on top of the substrate. One of the third lead 1120 and the fourth lead 1122 partially overlaps the nanowire 1108. The third lead 1120 is separated from the fourth lead 1122 by a dielectric layer, thereby providing a Dolan bridge Josephson junction 1118. The nanowire 1108 is configured to connect the quantum dot Josephson junction 1112 and the Dolan bridge Josephson junction 1118 in series.

According to an embodiment of the present invention, the first and second leads 1114, 1116 of the quantum dot Josephson junction 1112 extend substantially perpendicular to the nanowire 1108. However, embodiments of the invention are not limited to this configuration. The first and second leads 1114, 1116 of the quantum dot Josephson junction 1112 may have other orientations with respect to each other, and to the nanowire 1108.

According to an embodiment of the present invention, the first portion of the substrate forming the nanowire 1108 includes indium arsenide (InAs), and the second portion of the substrate includes InAs implanted with ions. The ions may include, for example, helium ions or hydrogen ions. The nanowire 1108 according to an embodiment of the present invention has a width less than 50 nm, and a length between 100 nm and 1000 nm. The nanowire 1108 according to an embodiment of the present invention has a length between 500 nm and 1000 nm.

According to an embodiment of the present invention, the third lead 1120 of the Dolan bridge Josephson junction 1118 extends substantially perpendicular to the fourth lead 1122. The third lead 1120 of the Dolan bridge Josephson junction 1118 may also extend substantially perpendicular to the nanowire 1108. However, embodiments of the invention are not limited to these orientations of the third lead 1120 with respect to the fourth lead 1122 and the nanowire 1108.

According to an embodiment of the present invention, the quantum circuit 200 includes a nanowire source lead 222 and a nanowire drain lead 224 formed on the substrate 202. The nanowire source lead 222 overlaps the nanowire 204 at a first end of the nanowire 204, and the nanowire drain lead 224 overlaps the nanowire 204 at a second end of the nanowire 204.

According to an embodiment of the present invention, method of producing a nanowire includes forming a mask on a substrate to cover a first portion of the substrate, implanting a second portion of the substrate not covered by the mask with ions, and removing the mask, thereby providing a nanowire comprising the first portion of the substrate. An example of the method of producing a nanowire is schematically illustrated in FIGS. 3A-4B. The ions according to an embodiment of the present invention may include helium ions or hydrogen ions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of producing a quantum circuit, comprising:
   forming a mask on a substrate to cover a first portion of said substrate;
   implanting a second portion of said substrate not covered by said mask with ions; and
   removing said mask, thereby providing a nanowire comprising said first portion of said substrate;
   forming a first lead and a second lead on top of said substrate, said first lead being spaced apart from said second lead, said first lead and said second lead each partially overlapping said nanowire, wherein, in operation, a portion of said nanowire between said first and second leads forms a quantum dot, thereby providing a quantum dot Josephson junction; and
   forming a third lead and a fourth lead on top of said substrate, one of said third lead and said fourth lead partially overlapping said nanowire, wherein said third lead is separated from said fourth lead by a dielectric layer, thereby providing a Dolan bridge Josephson junction,
   wherein said nanowire is configured to connect said quantum dot Josephson junction and said Dolan bridge Josephson junction in series.

2. The method according to claim 1, wherein forming said first lead and said second lead comprises forming said first lead and said second lead to be substantially perpendicular to said nanowire.

3. The method according to claim 1, wherein forming said third lead and said fourth lead comprises:
   forming said third lead on said substrate such that said third lead partially overlaps said nanowire;
   oxidizing said third lead to form said dielectric layer; and
   forming said fourth lead in contact with said dielectric layer.

4. The method according to claim 1, wherein said third lead extends substantially perpendicular to said fourth lead.

5. The method according to claim 1, wherein said third lead extends substantially perpendicular to said nanowire.

6. The method according to claim 1, further comprising:
   forming a nanowire source lead on said substrate, said nanowire source lead overlapping said nanowire at a first end of said nanowire; and
   forming a nanowire drain lead on said substrate, said nanowire drain lead overlapping said nanowire at a second end of said nanowire, said second end opposing said first end.

7. The method according to claim 1, wherein at least one of said forming said first and second leads and said forming said third and fourth leads comprises lift off processing.

* * * * *